United States Patent [19]

Sakaue

[11] Patent Number: 5,276,837
[45] Date of Patent: Jan. 4, 1994

[54] MULTIPORT RAM AND INFORMATION PROCESSING UNIT

[75] Inventor: Kenji Sakaue, Yokohama, Japan

[73] Assignee: Kabushiki Kaisha Toshiba, Kawasaki, Japan

[21] Appl. No.: 647,363

[22] Filed: Jan. 29, 1991

[30] Foreign Application Priority Data

Jan. 30, 1990 [JP] Japan ................................. 2-17907

[51] Int. Cl.[5] .................... G06F 13/00; G11C 7/00; G11C 11/413
[52] U.S. Cl. ............................. 395/425; 365/230.05; 365/189.04; 365/203
[58] Field of Search ............... 365/230.05, 189.04, 365/233; 364/DIG.; 395/425

[56] References Cited

U.S. PATENT DOCUMENTS

| 4,833,651 | 5/1989 | Seltzer et al. | 365/230.05 |
|---|---|---|---|
| 4,860,263 | 8/1989 | Mattavsch | 365/189.04 |
| 4,888,741 | 12/1989 | Malinowski | 365/230.05 |
| 4,987,559 | 1/1991 | Miyauchi | 365/230.05 |
| 5,010,519 | 4/1991 | Yoshimoto et al. | 365/149 |
| 5,062,081 | 10/1991 | Runaldue | 365/230.05 |

FOREIGN PATENT DOCUMENTS

0178163 4/1986 European Pat. Off. .
3838942 5/1989 Fed. Rep. of Germany ..

OTHER PUBLICATIONS

K. Sakaue et al., "A 0.8μBiCMOS ATM switch on the 800 Mbps asynchronous buffered banyan network", 1990 Symposium on VLSI Circuits, Digest of Technical Papers, Jun. 7-9, 1990, pp. 65-66.

*Primary Examiner*—Alyssa H. Bowler
*Attorney, Agent, or Firm*—Foley & Lardner

[57] ABSTRACT

A multiport RAM comprises a memory section formed of many unit memory cells which are positioned to an orderly matrix of M columns by N rows, a write address designation section for designating the unit memory cells on the prescribed rows, a write clock signal by which the input data is synchronized in the write operation that the data is written in the unit memory cells designated by the write address designation section, a read address designation section for designating the unit memory cells on one or more prescribed rows, and a read clock signal by which the output data is synchronized in the read operation that the data is read out from the unit memory cells designated by the read address designation section, having no relation with the write private clock signal.

19 Claims, 16 Drawing Sheets

MULTIPORT RAM AND INFORMATION PROCESSING UNIT

BACKGROUND OF THE INVENTION

1. Field of the invention

The present invention relates to a multiport RAM in which the read/write operation is capable even if one clock signal for deciding a read timing has no relation with another clock signal for deciding a write timing in the frequency and synchronization and an information processing unit in which data are transmitted through the multiport RAM between two apparatuses.

2. Description of the Background Art

In general, the operation that a data provided from an apparatus A is once memorized in a multiport RAM and the memorized data is read out and provided to an apparatus B is often carried out when the data transmission is carried out between the apparatus A and the apparatus B in the information processing unit.

For example, a conventional structure for carrying out the above mentioned data transmission is explained with reference to FIG. 1 as follows.

FIG. 1 shows that a data memorized in one apparatus A operated by a clock signal CK1 is transmitted to another apparatus B operated by a clock signal CK2 having no relation with the signal CK1 and is memorized into a dual port RAM 1 to use the data for the processing in the apparatus B. Also, FIGS. 2A and 2B shows a timing chart of the signals shown in FIG. 1.

As shown in FIG. 1, the apparatus A is provided with a register RA for providing a 16 bits data to the apparatus B in synchronization with the clock signal CK1. Also the apparatus B is provided with the dual port RAM 1 formed of a 32 bit by 16 word array as a register file. The dual port RAM 1 processes a 32 bit data in synchronization with the clock signal CK2 which is formed by demultiplying the clock signal CK1 to a half frequency in a frequency divider 2. In other words, the 32 bit data which is 2 times as wide as the 16 bit data in the apparatus A is processed in a half processing speed in comparison with a processing speed in the apparatus A.

To match the timing in the data transmission between the apparatus A and the apparatus B, the apparatus B is also provided with buffer registers R1 and R2 in parallel with each other for matching the data width and the operational timing. The 16 bit data, which are memorized into the register RA and are provided to the buffer register R1, R2 by turns in synchronization with the clock signal CK1.

In addition, the apparatus B is provided with a control section 3 for controlling the 16 bit data transmission from the buffer register R1 and R2 to the dual port RAM 1 and the 32 bit data transmission from the dual port RAM 1 to the apparatus B. The control section provides a write signal W1 synchronized with the clock signal CK2 to the buffer register R1 and also provides an inverted signal W2 of the write signal W1 to the buffer register R2. Therefore, the first prescribed 16 bit data D1 memorized in the register RA is at first provided to the buffer register R1 in synchronization with a leading edge of the write signal W1. And then the write operation is completed in synchronization with the first trailing edge of the write signal W1 after the leading edge while the second 16 bits data D2 memorized in the register RA is provided to the buffer register R2 in synchronization with the leading edge of the inverted write signal W2.

The data respectively memorized in buffer registers R1 and R2 are read out in synchronization with the write signal W1 and the inverted write signal W2 in turn and are coupled with each other to make up the 32 bit data provided to the input port of the dual port RAM 1. Thereafter the 32 bit data is memorized in the dual port RAM 1 in synchronization with the clock signal CK2 and under control of a read enable signal RE and a read address signal RA to use for the processing in the apparatus B.

However, elements such as the buffer registers R1 and R2 for constructing the above mentioned system are necessary to match the timing of the data transmission when the data transmission is carried out through the dual port RAM 1 between the apparatuses A, B which are respectively operated in accordance with the clock signals CK1, CK2 having no relation with each other.

FIG. 3 is a block diagram similar to FIG. 1, showing another conventional system in which the data transmission is carried out through the dual port RAM 1 between the apparatuses A and B which are respectively operated in accordance with clock signals CKA, CKB having the same frequency and no synchronization with each other. Also FIG. 4 and FIG. 5 are respectively a timing chart of the signals shown in FIG. 3.

As shown in FIG. 3, a 32 bit data memorized in a register RA of the apparatus A is transmitted to the apparatus B. To match the timing in the data transmission between apparatuses A and B, the apparatus B is provided with prebuffers PB1, PB2 in series with each other in the upstream of the dual port RAM 1 and the data transmission is carried out in a so-called hand shaking method.

In the apparatus A, a write go signal WG for requesting the write operation to the prebuffer PB1 is provided to a control section 5 in the apparatus B from a control section 6 in the apparatus A in synchronization with a leading edge of the clock signal CKA to transmit the 32 bit data memorized in a register RA to the apparatus B.

In the control section 5, the write go signal WG is sampled in synchronization with a leading edge timing T1 of a high frequency clock signal CKB4, which has a frequency 4 times the frequency of clock signal CKA or CKB, to detect a phase shift between the clock signals CKA and CKB. Then a write signal W1 is provided to the prebuffer PB1 when the output of the write go signal WG is detected.

In the prebuffer PB 1, the 32 bit data D1 is taken out from the register RA in synchronization with a leading edge timing T2 of the next pulse in the clock signal CKB4 in accordance with the write go signal W1. Also, an acknowledge signal AK is provided to the control section A from the control section B to stop the output of the write go signal WG in a prescribed timing after the write signal W1 is provided to the prebuffer PB1 from the control section 5. A write enable signal WE is provided to the dual port RAM 1 from the control section 5 in a prescribed timing after the write signal W1 is provided to the prebuffer PB1. Therefore, the data D1 is provided to the prebuffer PB2 after holding in the prebuffer PB1 to be provided to the input port of the dual port RAM 1 in synchronization with the clock signal CKB, and then the data D1 is memorized in the dual port RAM 1 in accordance with a write address signal WA provided from the control section 5.

The timing that the write enable signal WE is provided to the dual port RAM 1 is changeable in accordance with the timing that the write go signal WG is sampled and detected so that two kinds of the timing that the write go signal WG is sampled and detected are shown in FIG. 4 and FIG. 5. In FIG. 4, the write go signal WG is sampled at the first leading edge timing of the clock signal CKB4 occurred after a leading edge timing of the clock signal CKB. On the other hand, the write go signal WG is sampled at the third leading edge timing of the clock signal CKB4 occurred after a leading edge timing of the clock signal CKB in FIG. 5.

Accordingly, when the data transmission is carried out through the dual port RAM 1 between the apparatuses A and B respectively operated by the clock signals CKA and CKB having no relation with each other, elements such as the prebuffers PB1, PB2 for constructing the above mentioned system are necessary to match the timing of the data transmission even if the data in the apparatus A has the same bit number with the data in the apparatus B.

As mentioned above, the elements such as buffers are necessary to match the timing of the data transmission in an inlet of a multiport RAM when the data transmission is carried out through the multiport RAM between the apparatuses respectively operated by the clock signals having no relation with each other. This means that the timing of the output processing depends on the timing of the input processing in the multiport RAM. In other words, it is impossible to control the input processing (the write operation) and the output processing (the read operation) independently each other because the timing of the input/output can not set up freely.

Accordingly, in the information processing unit in which the multiport RAM is used for a so-called pipeline processing as a register file, the stage number of the pipeline processing is increased by the number of the elements added for matching the timing of the data transmission. Therefore, the structure of the system is in a large scale while the processing speed is lowered, and the design for matching the timing is complicated.

Therefore, the conventional multiport RAM controlled the input/output processing by a single clock signal is not suitable for the data transmission in the information processing unit mentioned above.

SUMMARY OF THE INVENTION

It is one object of the present invention to provide a multiport RAM which is suitable for the data transmission between apparatuses respectively operated by clock signals having no relation with each other.

It is the second object of the present invention to provide an information processing unit in which the data transmission can be carried out without a large scale system, the deterioration of the processing speed, and the complicated design for matching the timing.

According to one modification of the invention to solve the first object, we provide a multiport RAM comprising;

a memory section formed of many unit memory cells which are positioned to an orderly matrix of M columns by N rows (M and N are respectively a natural number);

a write address designation section for designating one or more prescribed rows in the memory section to write an input data;

a write private clock signal by which the input data is synchronized in the write operation in which the data is written in the unit memory cells on the rows designated by the write address designation section;

a read address designation section for designating one or more prescribed rows in the memory section to read out an output data; and a read private clock signal by which the output data is synchronized in the read operation in which the data is read out from the unit memory cells on the rows designated by the read address designation section, having no relation with the write private clock signal.

In the above structure according to the invention, an input data is written in the unit memory cells on one or more prescribed rows designated by the write address designation section in synchronization with a write private clock signal when the write operation to the multiport RAM is carried out. Also, when the read operation from the multiport RAM is carried out, an output data is read out from the unit memory cells on one or more prescribed rows designated by the read address designation section in synchronization with a read private clock signal having no relation with the write private clock signal.

Accordingly, the elements such as a delay circuit are not needed to match the timing of the both private clock signals with each other because it is capable to carry out the input/output operation even if the read private clock signal has no relation with the write private clock signal in the frequency and synchronization.

According to the second modification of the invention to solve the first object, we provide a multiport RAM comprising a memory section formed of an orderly matrix of unit memory cells of M columns by N rows (M and N are respectively a natural number);

write address signals for designating one or more prescribed columns and rows in the memory section as a write address;

a write clock signal by which an input data is synchronized in the write operation in which the data is written in the unit memory cells on the columns and rows designated by the write address signals;

a write control signal generating section for generating write control/address signals by which the input data is written in the unit memory cells on the columns and rows designated by write address signals in synchronization with the write clock signal;

read address signals for designating one or more prescribed columns and rows in the memory section as a read address;

a read clock signal by which an output data is synchronized in the read operation in which the data is read out from the unit memory cells on the columns and rows designated by the read address signals; and a read control signal generating section for generating read control/address signals by which the output data is read out from the unit memory cells on the columns and rows designated by read address signals in synchronization with the read clock signal having no relation with the write clock signal.

In the above structure according to the invention, one or more unit memory cells is/are specified by designating the columns and rows in the memory section in accordance with the write address signals when the write operation to the multiport RAM is carried out. And then, an input data is written in the specified unit memory cells in synchronization with the write clock signal. Also, when the read operation from the multiport RAM is carried out, one or more unit memory cells is/are specified by designating the column and row in the memory section in accordance with the read address signals. And then, an output data is read out from the specified unit memory cells in synchronization with the read clock signal having no relation with the write clock signal.

Accordingly, the elements such as a delay circuit are not needed to match the timing of the both clock signals with each other because it is capable to carry out the write/read operation even if the read clock signal has no relation with the write clock signal in the frequency and synchronization.

Also, as one or more unit memory cells is/are specified by designating both the column and row in the memory section, it is capable to efficiently use the unit memory cells arranged in two dimensions in comparison with the write/read operation in which either the column or the row is designated in one dimension.

According to the one modification of the invention to solve the second object, we provide an information processing unit comprising a register in which an input data is memorized to provide the data to a data receiving section in synchronization with a write clock signal;

a multiport RAM formed of an orderly matrix of unit memory cells in the data receiving section, the input data written in one or more rows of the unit memory cells;

a write control section for controlling the write operation by transmitting a write address signal to the multiport RAM in synchronization with a write clock signal to select one or more unit memory cells in which input data are respectively memorized; and a read control section for controlling the read operation by transmitting a read address signal to the multiport RAM in synchronization with a read clock signal to select one or more unit memory cells, the read clock signal having no relation with the write clock signal.

In the above structure according to the invention, an input data is transmitted from the register and memorized to the unit memory cells in the multiport RAM designated by a write address signal in synchronization with a write clock signal when the write operation to the multiport RAM is carried out. Also, when the read operation from the multiport RAM is carried out, an output data is read out from the unit memory cells in the multiport RAM designated by a read address signal in synchronization with a read clock signal having no relation with the write clock signal.

Accordingly, it is capable to freely carry out the write/read operation without matching the timing between the write clock signal and the read clock signal by using the multiport RAM which can be operated by the both clock signals having no relation with each other in the frequency and synchronization. This means that the element such as a delay circuit is not needed to match the timing between the write operation and the read operation.

DESCRIPTION OF THE SPECIFIC EMBODIMENT

A first preferred embodiment in accordance with the invention is described with reference to the drawings as follows.

Figure 6:
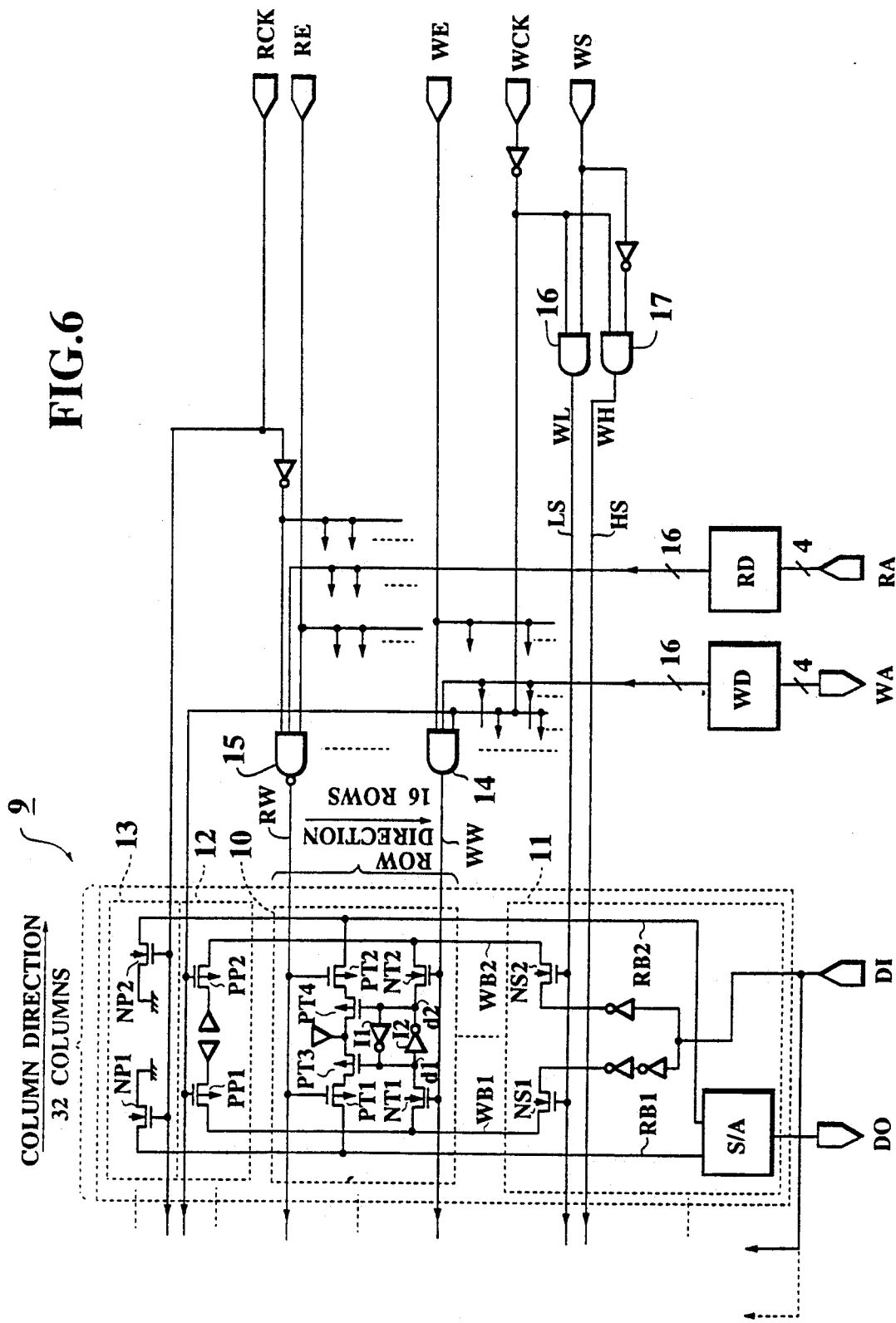
FIG. 6 is a block diagram of a dual port RAM in accordance with a first embodiment at a first aspect of the invention.

FIG. 6 is a block diagram of a dual port RAM in accordance with a first embodiment at a first aspect of the invention.

As shown in FIG. 6, the dual port RAM 30 is provided with a memory section 9 formed of unit memory cells 10 arranged to 32 columns by 16 rows, an input/output section 11, write/read precharge circuits 12, 13. In the dual port RAM 30, the write operation is controlled in synchronization with a write private clock signal WCK and the read operation is controlled in synchronization with a read private clock signal RCK.

The unit memory cells 10 are arranged to an orderly matrix to receive a 32 bits width data in the column direction and to receive a 16 words data (1 word is equal to 32 bits width data) in the row direction. And the unit memory cells 10 in the column direction are divided to a lower lank of 16 bits and a higher rank of 16 bits.

In the unit memory cell 10, an input data is memorized in a circuit formed of inverters I1, I2 connected with each input/output terminal. A connected points D1, D2 with the inverters I1, I2 are respectively connected to write private bit lines WB1, WB2 through transfer N channel FETs NT1, NT2 which are controlled the on/off operation on the same row in common by a write signal provided to a write private word line WW.

The write private bit lines WB1, WB2 are respectively precharged to the high level through P channel precharge FETs PP1, PP2 in the write precharge section 12 prior to the write operation, and the FETs PP1, PP2 are controlled the on/off operation by the inverted signal of the write private clock signal WCK. The input data is provided to the write private bit lines WB1, WB2 through N channel select FETs NS1, NS2 for selecting a prescribed column of the memory section 1 and memorized in a selected unit memory cell 10.

The N channel select FETs NS1, NS2 are respectively positioned in correspondence to the write private bit lines WB1, WB2. In the N channel select FETs NS1, NS2 corresponding to a 16 bits line of the lower rank, the on/off operation are respectively controlled by a lower rank write signal WL provided to a lower rank bit select line LS. On the other hands, in the N channel select FETs NS1, NS2 corresponding to another 16 bits line of the higher rank, the on/off operation are respectively controlled by a higher rank write signal WH provided to a higher rank bit select line HS. Therefore, the on/off operation is controlled every write unit of a lower 16 bits or a higher 16 bits under control of the lower/higher rank write signals WL, WH in the write operation.

In the unit memory cells 10, a data memorized in a unit memory cell 10 (in other words, the data means the electric potential in the connected points D1, D2) is read out to a pair of read private bit lines RB1, RB2 through P channel FETs PT3, PT4 and P channel FETs PT1, PT2. The P channel FETs PT3, PT4 is controlled by the electric potential in the connected points D1, D2. The P channel FETs PT1, PT2 are respectively controlled by a read signal provided to a read private word line RW connected to the same row in common.

Each of the 32 pairs of read private bit lines RB1, RB2 in common with the memory cells 10 provided to the same column is connected to each sense amplifier S/A which is provided in correspondence to each column of the memory cell 1. Therefore, each pairs of read private bit lines RB1, RB2 are discharged to the ground level through N channel FETs NP1, NP2 controlled by a read private clock signal RCK prior to the read operation. Then the data provided to the corresponding pair of read private bit lines RB1, RB2 is read out through the corresponding sense amplifier S/A as an output data DO in the read operation.

Next, the structure of the peripheral circuit of the memory section 1 in the dual port RAM 30 is explained.

Each of the write private word lines WW is connected with an output terminal of a corresponding AND gate 14. The AND gate 14 receives a write enable signal WE, a 16 bits write address signal WA provided from a write decoder WD and the inverted signal of the write private clock signal WCK. In the write decorder WD, a 4 bits write address signal WA is decorded to provide the 16 bits write address signal WA. The 16 bits write address signal WA is provided to the AND gates 14, which are respectively provided in correspondence to the row of the memory section 9, to select a prescribed row formed of 16 unit memory cells 10. The AND gates 14 and the write decorder WD constitute the write address designation section.

Each of read private word line RW is connected with an output terminal of a corresponding NAND gate 15. The NAND gate 15 receives a read enable signal RE, a 16 bits read address signal RA provided from a read decorder RD, and the inverted signal of the read private signal RCK. In the read decorder RD, a 4 bits read address signal RA is decorded to provide the 16 bits read address signal RA. The 16 bits read address signal RA is provided to the NAND gates 15, which are respectively provided in correspondence to the row of the memory section 9, to select a prescribed row formed of 16 unit memory cells 10. The NAND gates 15 and the read decorder RD constitute the read address designation section.

The lower rank bit select line LS is connected with a output terminal of an AND gate 16 receiving the inverted signal of the write private clock signal WCK and a write select signal WS for selecting the lower or higher rank bit. The higher rank bit select line HS is connected with a output terminal of an AND gate 17 receiving the inverted signal of the write private clock signal WCK and the inverted signal of the write select signal WS. The AND gates 16, 17 and the N channel select FETs NS1, NS2 constitute a column select section.

Figure 7:
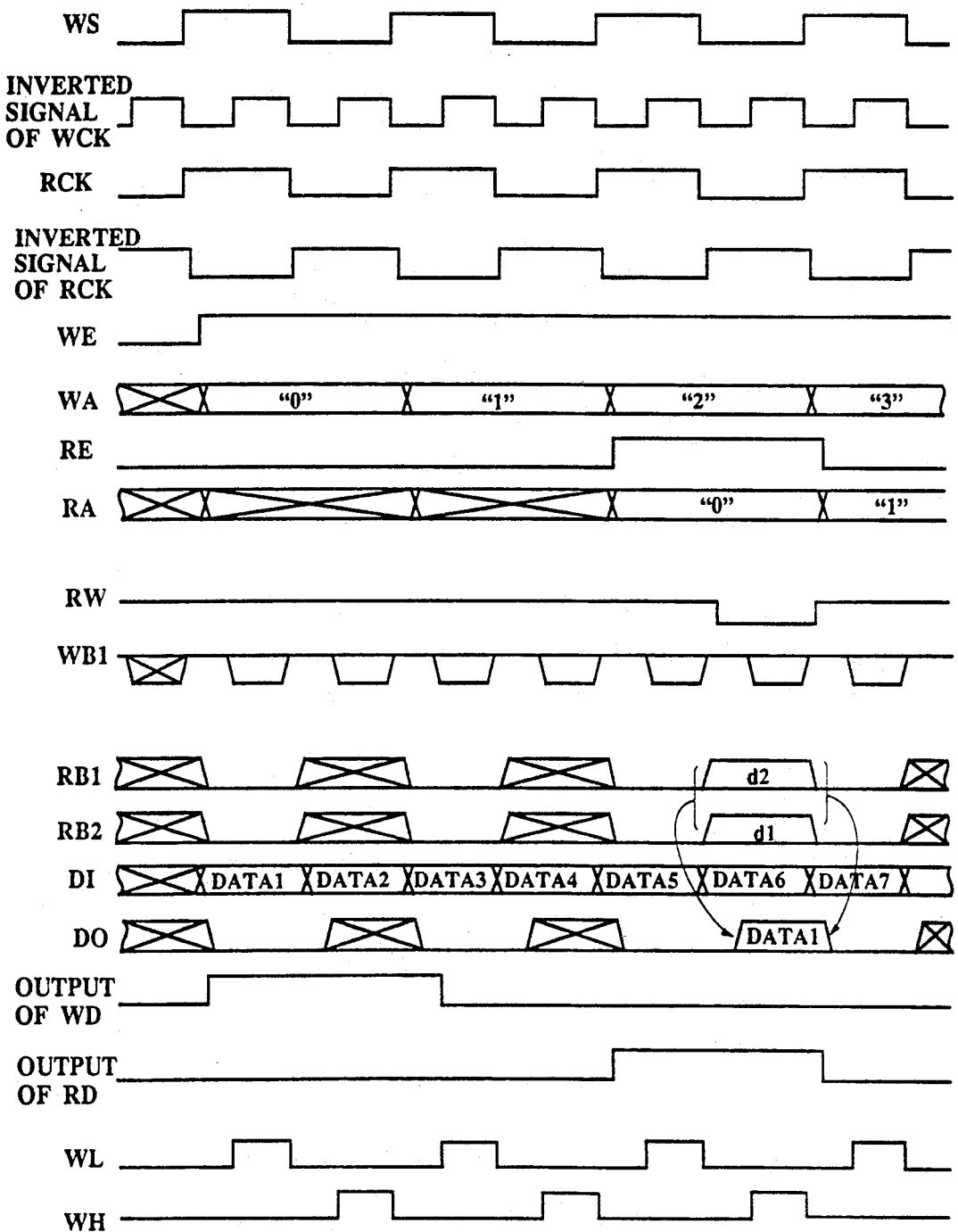
FIG. 7 is a timing chart of the signals as shown in FIG. 6.

Next, the operation in the dual port RAM 30 shown in FIG. 6 is explained with reference to a timing chart shown in FIG. 7.

At first, the write operation is explained.

When the inverted signal of the write private clock signal WCK is at the low level, the lower and higher rank write signals WL, WH are at the low level to turn off the N channel FETs NS1, NS2 controlling the transmission of the input data DI to the write private bit lines WB1, WB2 and the P channel precharge FETs PP1, PP2 are respectively turned on. By turning on the P channel precharge FETs PP1, PP2, all of 32 pairs of the write private bit lines WB1, WB2 are precharged to the supply voltage.

When the inverted signal of the write private clock signal WCK is changed to the high level, the precharge operation is completed. At this time, the lower rank write signal WL provided from the AND gate 16 is changed to the high level to turn on the N channel FETs NS1, NS2 corresponding to the lower rank of the unit memory cells 10 when the write select signal WS obtained by demultiplying the write private clock signal WCK to a half frequency is at the high level. This means that the column direction of the memory section 9 is designated to memory the input data DI.

On the other hands, when the write enable signal WE is at the high level to allow the input data DI to be memorized in the prescribed unit memory cells 10 and the 4 bits write address signal WA is provided to the write decoder WD to provide the 16 bits write address signal WA in which only one prescribed bit is at the high level, the selected AND gate 14 in corresponding to the specified bit at the high level provides a write signal at the high level to the corresponding unit memory cells 10 because the write enable signal WE and the lower rank write signal WL is at the high level. That is, the N channel FETs NT1, NT2 connected with the selected AND gate 14 through the write word line WW is turned on. This means that the row direction of the memory section 9 is designated to memory the input data DI to the lower rank bit.

In the above mentioned condition, when the input data DI is provided to the input port of the dual port RAM 30, the input data DI is transmitted to the write private bit lines WB1, WB2 through the N channel FETs NS1, NS2 which are turned on by the lower rank write signal WL to be memorized to the connected points D1, D2 in the prescribed unit memory cells 10 through the N channel FETs NT1, NT2 turned on. At this time, the inverted data in comparison with the input data DI is memorized to the connected point D2 while the data memorized to the connected point D1 is the same with the input data DI.

The inverters I1, I2 and the connected points D1, D2 constitute a latch circuit provided with static RAMs to hold the input data DI without consuming the power.

After the input data DI is memorized in the unit memory cells 10 which are at the lower rank 16 bits and corresponding to the specified word designated by the 16 bits write address signal WA, the write select signal WS is changed to the low level from the high level to change the higher rank write signal WH to the high level. Therefore, the N channel FETs NS1, NS2 corresponding to the higher rank 16 bits is turned on to select the unit memory cells 10 corresponding to the higher rank 16 bits in the same word.

In the above mentioned condition, when another input data DI is provided to the input port of the dual port RAM 30, the input data DI is memorized to the unit memory cells 10 at the higher rank 16 bits and corresponding to the specified word as mentioned above.

Consequently, it is capable for the data to be memorized to the prescribed word of the memory section 9 every 16 bits unit during 2 cycles of the write private clock signal WCK and 1 cycle of the write select signal WS because the word is designated by the 16 bits write address signal and the column direction is divided to the lower/higher rank 16 bits.

Accordingly, it is capable for the desired data to be memorized to the desired address in turn under control of the write private clock signal WCK and the write address signal WA. In other words, the two 16 bits data are memorized as one word of 32 bits.

Next, the read operation is explained.

The read operation is carried out by using the read private clock signal RCK obtained by demultiplying the write private clock signal WCK to a half frequency. The read private clock signal RCK is formed from the write private clock signal WCK in this embodiment for convenience' sake. However it is allowed for the signal RCK to have no relation with the signal WCK, for example, in the frequency and synchronization.

When the read private clock signal RCK is at the high level, the N channel FETs NP1, NP2 connected with the read private bit lines RB1, RB2 is turned on and the lines RB1, RB2 is discharged to the ground level prior to the read operation. Then, when the read private clock signal RCK is changed to the low level, the precharge operation is completed.

Thereafter, when a 4 bits read address signal RA is provided to the read decoder RD in synchronization with the read private clock signal RCK to be decoded and changed to a 16 bits read address signal RA. One specified bit in the 16 bits read address signal is at the high level.

Therefore, when a read enable signal RE is at the high level in synchronization with the read private clock signal RCK and an inverted signal of the read private clock signal RCK is at the high level after the pre-discharge operation, one of the read signals provided from the NAND gates 15 is changed to the low level selectively because the selected NAND gate 15 is only provided the high level bit in the 16 bits read address signal RA.

Accordingly, a private word line RW connected with the selected NAND gates 15 is changed to the low level so that the prescribed P channel FETs PT1, PT2 connected to the private word line RW is turned on. That is, the memory cells 10 equivalent to 32 bits (1 word) are selected to read out an output data DO equivalent to a word.

When the P channel FETs PT1, PT2 are turned on, the condition of the P channel FETs PT3, PT4 are decided in dependence on the data memorized to the connected points D1, D2 in the memory cells 10. For example, when the data memorized to the connected points D1 is "1" (the high level) and the data memorized to the connected points D2 is "0" (the low level), the P channel FET PT3 is turned off and the P channel FET PT4 is turned on. Therefore, the read private bit line RB2 is charged by a supply source between the P channel FETs PT3, PT4 to be changed to the high level and the read private bit line RB1 is kept to the low level. In other words, the data memorized to the connected point D1 is provided to the read private bit line RB2 and the data memorized to the connected point D2 is provided to the read private bit line RB1. Similarly, when the data memorized to the connected points D1 is "0" (the low level) and the data memorized to the connected points D2 is "1" (the high level), the data memorized to the connected points D1, D2 are respectively provided the read private bit line RB2, RB1.

Each of the data provided to the read private bit line RB1, RB2 is provided to the sense amplifier S/A to be amplified and is read out from the output port of the dual port RAM 30.

As mentioned above, the read operation is carried out in synchronization with the read private clock signal RCK only and has no relation to the any control signal in the write section. Accordingly when the write address signal and the read address signal are respectively and independently provided to the dual port RAM 30 in accordance with the invention, it is capable to independently and simultaneously carry out the write operation and the read operation in accordance with each private clock signal. Therefore the input/output processing are more free in comparison with the conventional dual port RAM controlled both of the input/output processing by a single clock signal.

Next, we explain a dual port RAM in accordance with a second modification at the first aspect of the invention with reference to FIG. 8 as follows.

Figure 8:
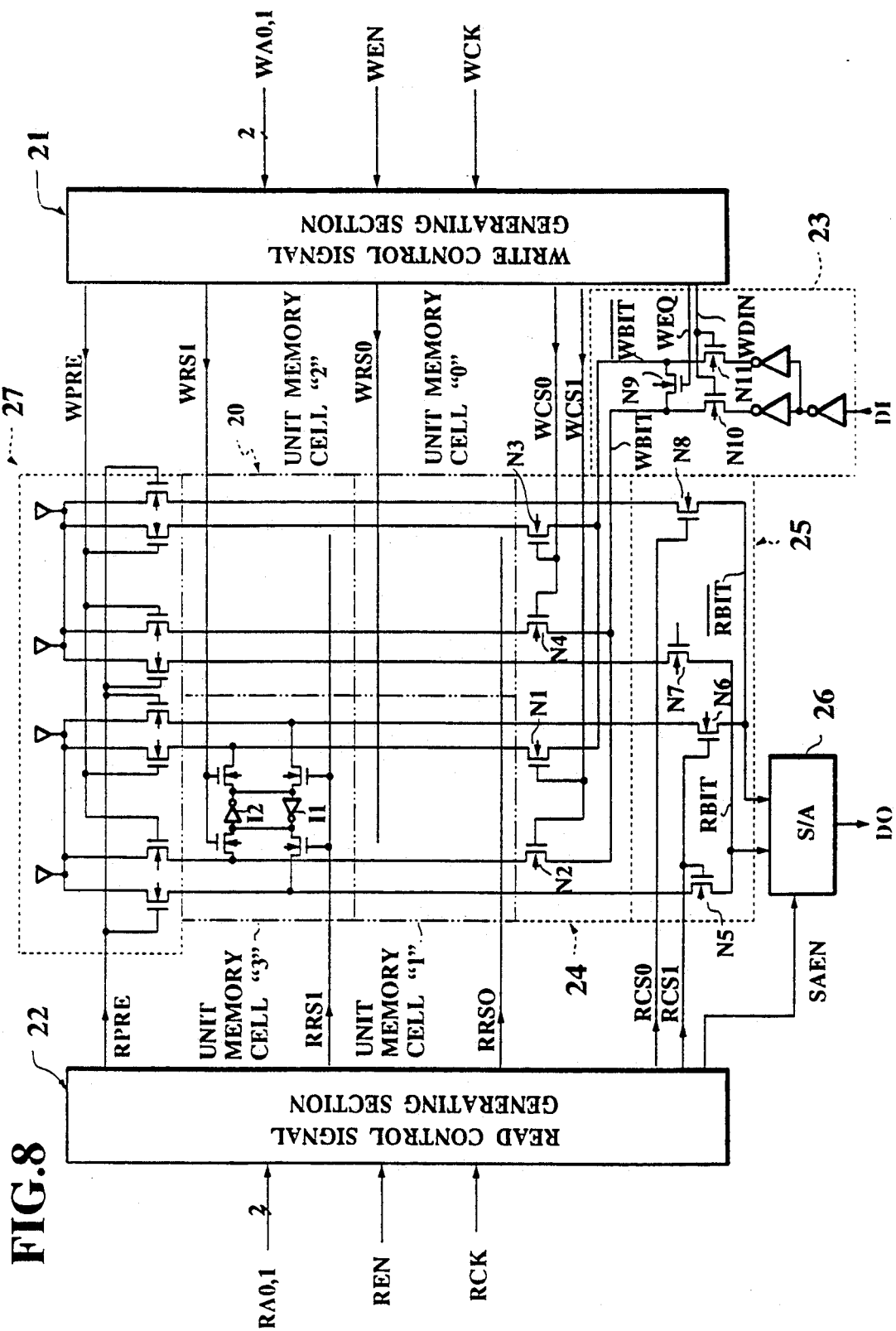
FIG. 8 is a block diagram of another dual port RAM in accordance with a second modification at the first aspect of the invention.

As shown in FIG. 8, the dual port RAM comprises a memory section 20, a write control signal generating section 21 for receiving write address signals WA0, WA1, a write enable signal WEN and a write clock signal WCK and providing write control/address signals to the unit memory cells 20, and a read control signal generating section 22 for receiving read address signals RA0, RA1, a read enable signal REN and a read clock signal RCK and providing read control/address signals to the unit memory cells 20.

The memory section 20 is provided with 4 unit memory cells '0', to '3' similar to the unit memory cell 10 as shown in FIG. 6 at two columns by two rows, a data input section 23 for receiving an input data DI, a write column select section 24 for selecting one of two columns in the memory section 20 in the write operation, a read column select section 25 for selecting one of two columns in the memory section 20 in the read operation, a sense amplifier 26 for amplifying signals on read private lines, and a precharge section 27 for precharging write private lines and the read private lines.

The write control/address signal provided from the write control signal generating section 21 are formed of write column select signals WCS0, WCS1 for selecting a column in the memory section 20 at the write operation, write row select signals WRS0, WRS1 for selecting a row in the memory section 20 at the write operation, a write precharge signal WPRE for precharging the write private lines, a write equalizing signal WEQ for equalizing the electric potential in the write private lines each other, and a write data input enable signal WDIN for controlling the write timing of the input data DI provided to the memory section 20.

The read control/address signals provided from the read control signal generating section 22 are formed of read column select signals RCS0, RCS1 for selecting a column in the memory section 20 at the read operation, read row select signals RRS0, RRS1 for selecting a row in the memory section 20 at the read operation, a read precharge signal RPRE for precharging the read private lines, and a sense amplifier operation enable signal SAEN for controlling the operation in the sense amplifier 26.

The write column select section 24 in the memory section 20 is formed of N channel FETs N1 to N4 positioned on the write private lines respectively. The write column select signal WCS1 is provided to the gates of the N channel FETs N1, N2 while the write column select signal WCS0 is provided to the gates of the N channel FETs N3, N4.

The read column select section 25 in the memory section 20 is formed of N channel FETs N5 to N8 positioned on the read private lines respectively. The read column select signal RCS1 is provided to the gates of the N channel FETs N5, N6 while the read column select signal RCS0 is provided to the gates of the N channel FETs N7, N8 is.

The data input section 23 in the memory section 20 is formed of N channel FET N9 for connecting a paire of write private lines with each other in each unit memory cell by provided the write equalizing signal WEQ to the gate thereof and N channel FETs N10, N11 for controlling the operation in which the input data DI is transmitted to the write private lines by provided the write data input enable signal WDIN to the gate thereof.

Figure 9:
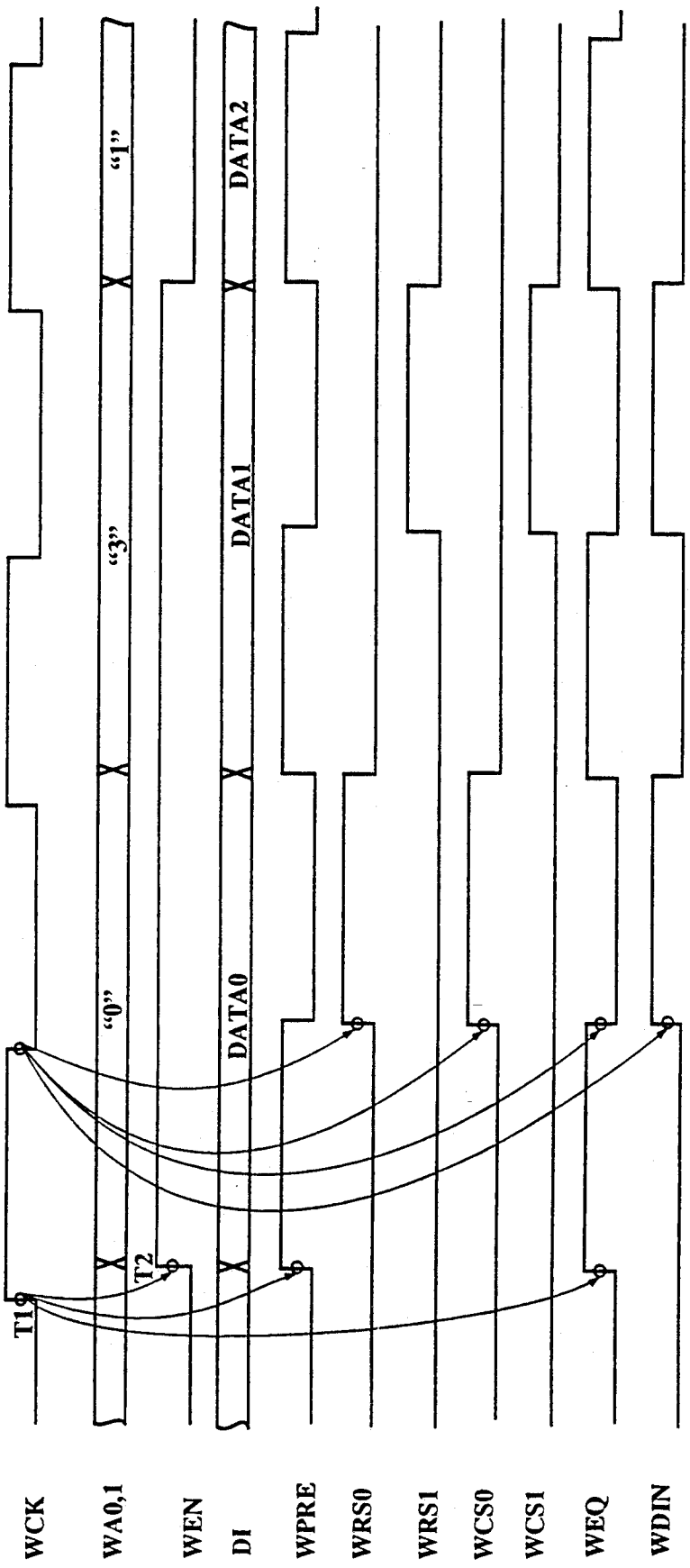
FIG. 9 is a timing chart of the signals in the write operation as shown in FIG. 8.
Figure 10:
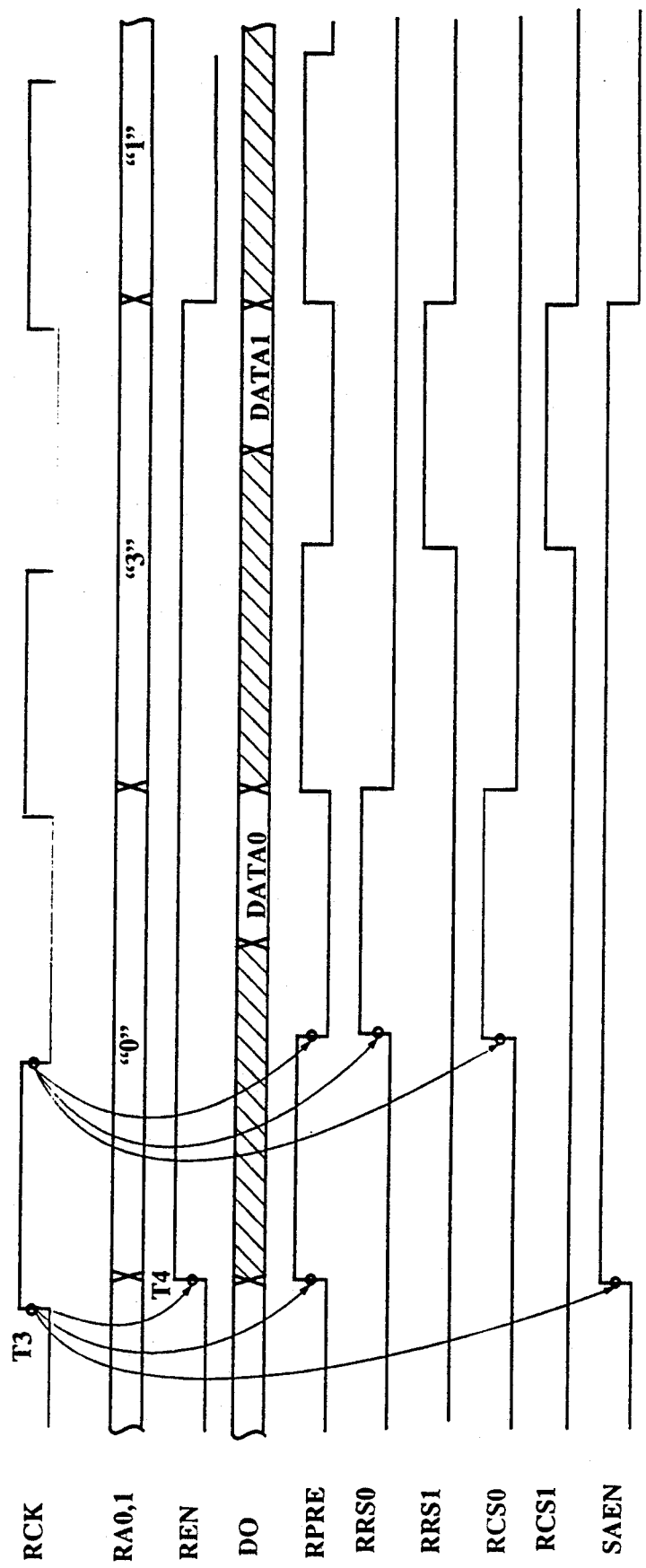
FIG. 10 is a timing chart of the signals in the read operation as shown in FIG. 8.

In the above structure, we explain the operation of the dual port RAM in accordance with the invention with reference to the timing charts in FIG. 9 and FIG. 10.

At first, as the timing between the signals in the write operation is shown in FIG. 9, when the write clock signal WCK is risen up at time T1, the write address signals WA0, WA1 designating the address "0" are transmitted to the write control signal generating section 21 in synchronization with the leading edge of the write enable signal WEN at time T2. Also, the input data DI is stood by to be transmitted to the memory section 20 and the electrical potential of data input lines are equalized with each other by the write equalizing signal WEQ to disappear the difference in the electrical potential between the lines, occurred in the previous cycle. Then, the write precharge signal WPRE is transmitted to the precharge section 27 to change the write private lines to the high level in synchronization with the write clock signal WCK.

Thereafter, when the write clock signal WCK is changed to the low level, the row/column select signals WRS0, WRS1, WCS0, and WCS1 depending on the write address signals WA0, WA1 are transmitted to the memory section 20 to designate a prescribed unit memory cell to be provided the input data DI. That is, the unit memory cell '0' is designated because the signals WRS0, WCS0 are at the high level respectively in this preferred embodiment. At the same time, the input data DI is transmitted to the unit memory cell '0' in the memory section 20 to be memorized because of the signal WDIN at the high level.

Next, the read operation is explained with reference to FIG. 10.

When the read clock signal RCK is risen up at time T3, the read address signals RA0, RA1 designating the address '0' are transmitted to the read control signal generating section 22 in synchronization with the leading edge of the read enable signal REN at time T4. Then, in the read control signal generating section 22, the read precharge signal RPRE is transmitted to the precharge section 27 to change the read private lines to the high level in synchronization with the read clock signal RCK. Also, at the same time, the sense amplifier 26 is changed to the operation condition because the sense amplifier operation enable signal SAEN is at the high level.

Thereafter, when the read clock signal RCK is changed to the low level, the row/column select signals RRS0, RRS1, RCS0, and RCS1 depending on the read address signals RA0, RA1 are transmitted to the memory section 20 to designate a prescribed unit memory cell. That is, the unit memory cell '0' is designated because the signals RRS0, RCS0 are at the high level respectively in this preferred embodiment. Then, the data memorized in the unit memory cell '0' is read out through the read column select section 25 and the sense amplifier 26.

Accordingly, the unit memory cell is specified by designating both of the row and column numbers in the memory section 20 without having no relation between the write clock signal WCK and the read clock signal RCK in this embodiment while the unit memory cells in the embodiment shown in FIG. 6 are specified by designating the row number only. In short, the unit memory cells are able to be utilized at two dimensions. This means that the electric consumption in the dual port RAM is able to be lowered and the access time is able to be shortened.

Next, an information processing unit is explained with reference to FIG. 11 and FIG. 12 in which the operation timing is shown.

Figure 11:
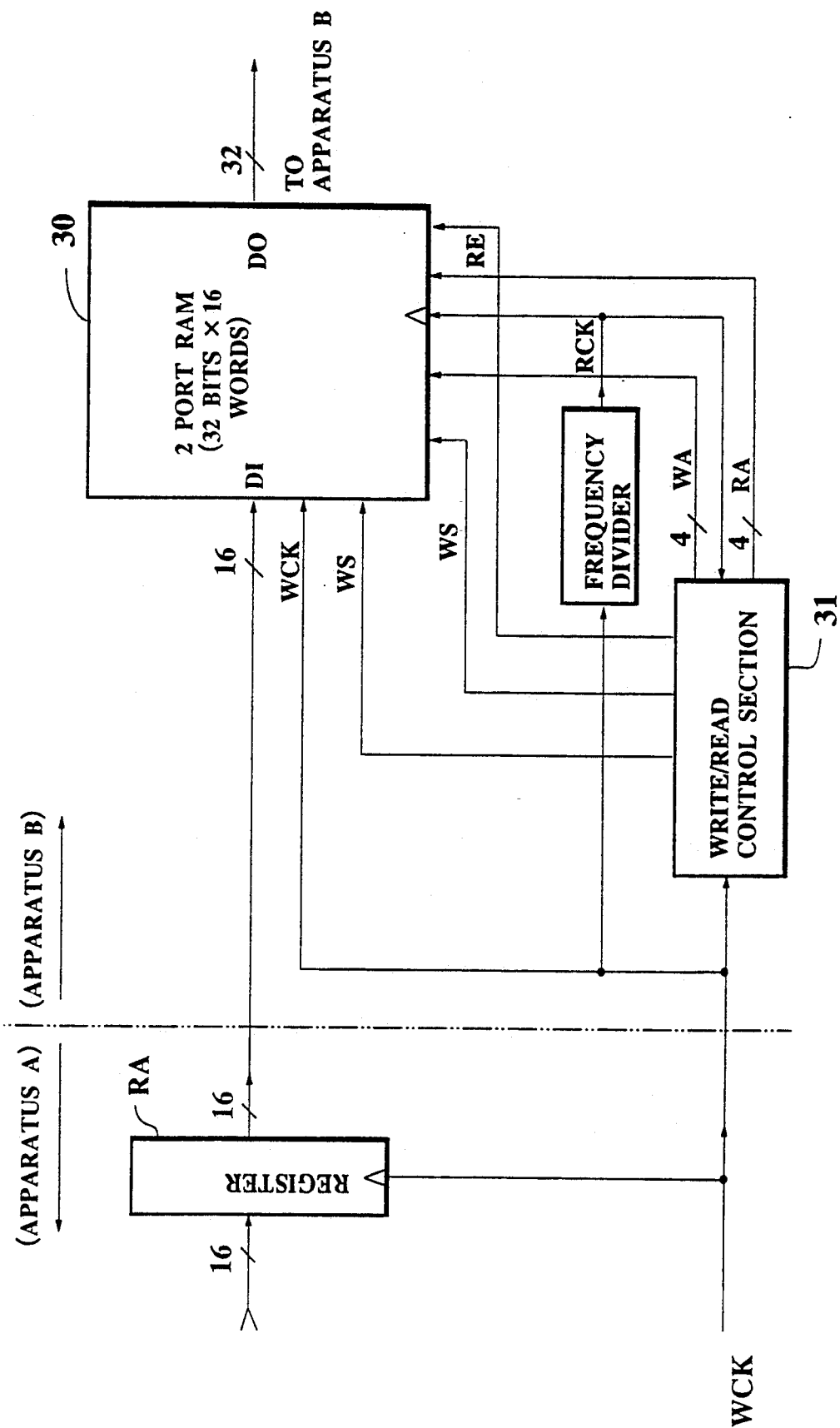
FIG. 11 is a block diagram of an information processing unit including the dual port RAM as shown in FIG. 6 in accordance with a first embodiment at a second aspect of the invention.
Figure 12:
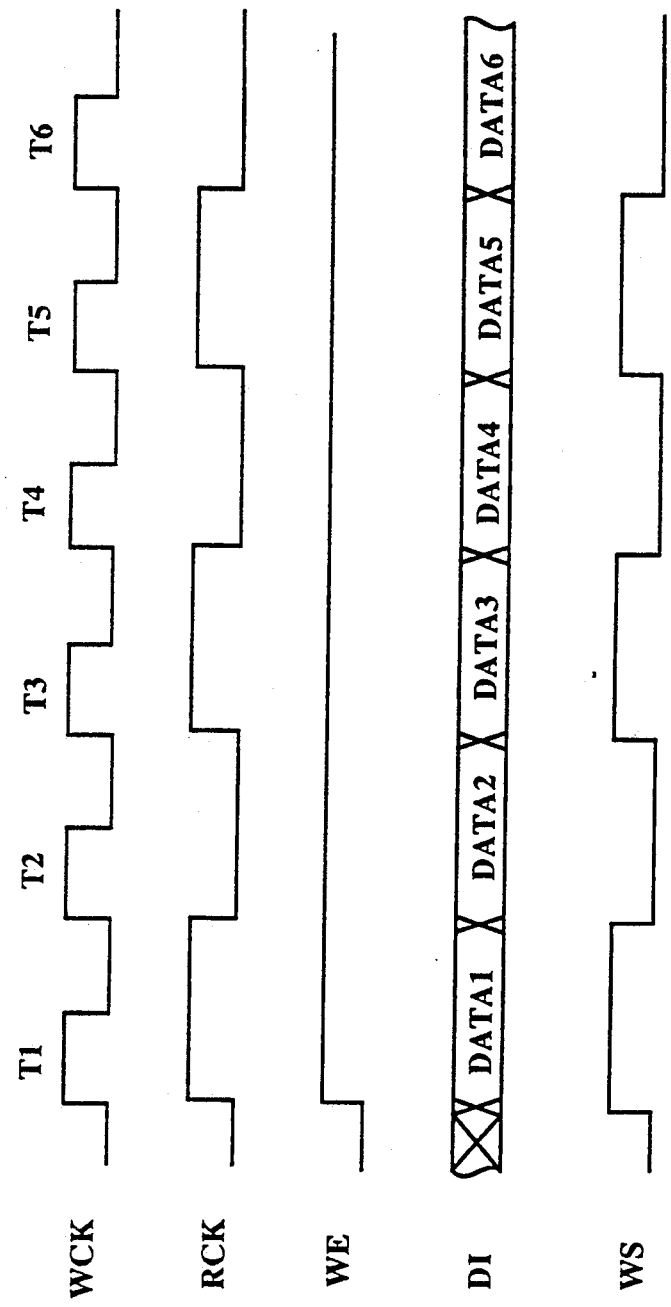
FIG. 12 is a timing chart of the signals as shown in FIG. 11.

FIG. 11 is a block diagram of an information processing unit including the dual port RAM as shown in FIG. 6 and FIG. 12 is a timing chart for the information processing unit as shown in FIG. 11.

Figure 1:
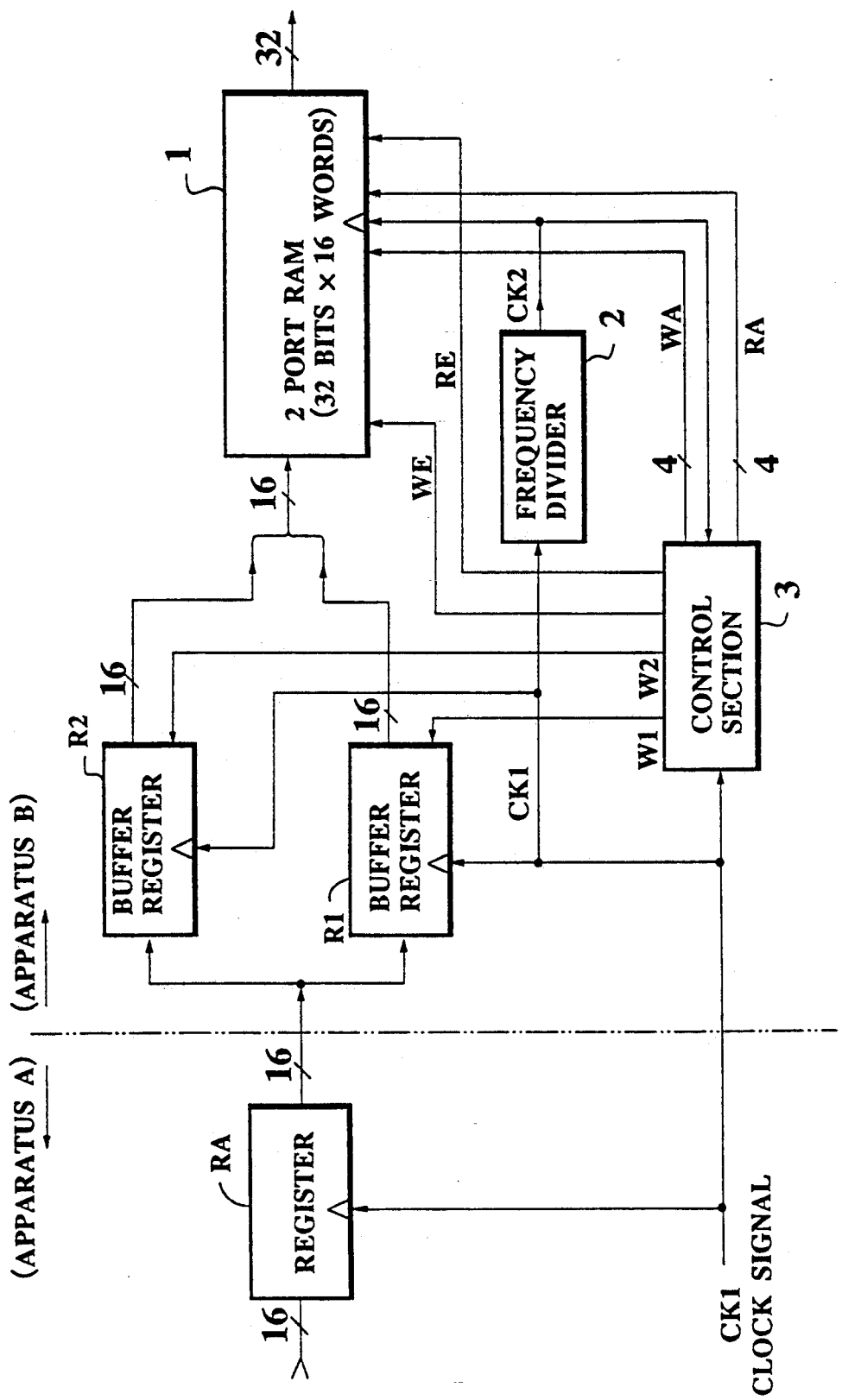
FIG. 1 is a block diagram of a conventional information processing unit.

The information processing unit shown in FIG. 11 is shown for the comparison with the information processing unit shown in FIG. 1.

As shown in FIG. 11, the information processing unit comprises a register RA for providing a 16 bits data to an apparatus B from an apparatus A in synchronization with the write clock signal WCK, the dual port RAM 30 for receiving the data from the register RA as an input data DI in synchronization with the write clock signal WCK, a write/read control section 31 for controlling the dual port RAM 30 in which the control/address signals such as the write select signal WS, the write/read enable signals WE, RE and the write/read address signals WA, RA are provided, and a frequency divider 32 for providing the read clock signal RCK to the dual port RAM 30.

The read clock signal RCK is made from the write clock signal WCK by demultiplied to the half frequency in this embodiment for convenience' sake. However the read clock signal RCK is allowed to be formed in a suitable clock circuit on the outside. In this case, no matching circuit such as a delay circuit is needed between the read clock signal RCK and the write clock signal WCK.

In the above mentioned structure, each 16 bits data provided to the input port of the dual port RAM 30 in synchronization with each write clock signal WCK is memorized to unit memory cells 10 in the lower and higher ranks in a prescribed row in turn in accordance with the write select signal WS. In short, two 16 bits data are memorized to the prescribed row as a 32 bits data in the write operation, and the 32 bits data is read out in the read operation.

Figure 2A:
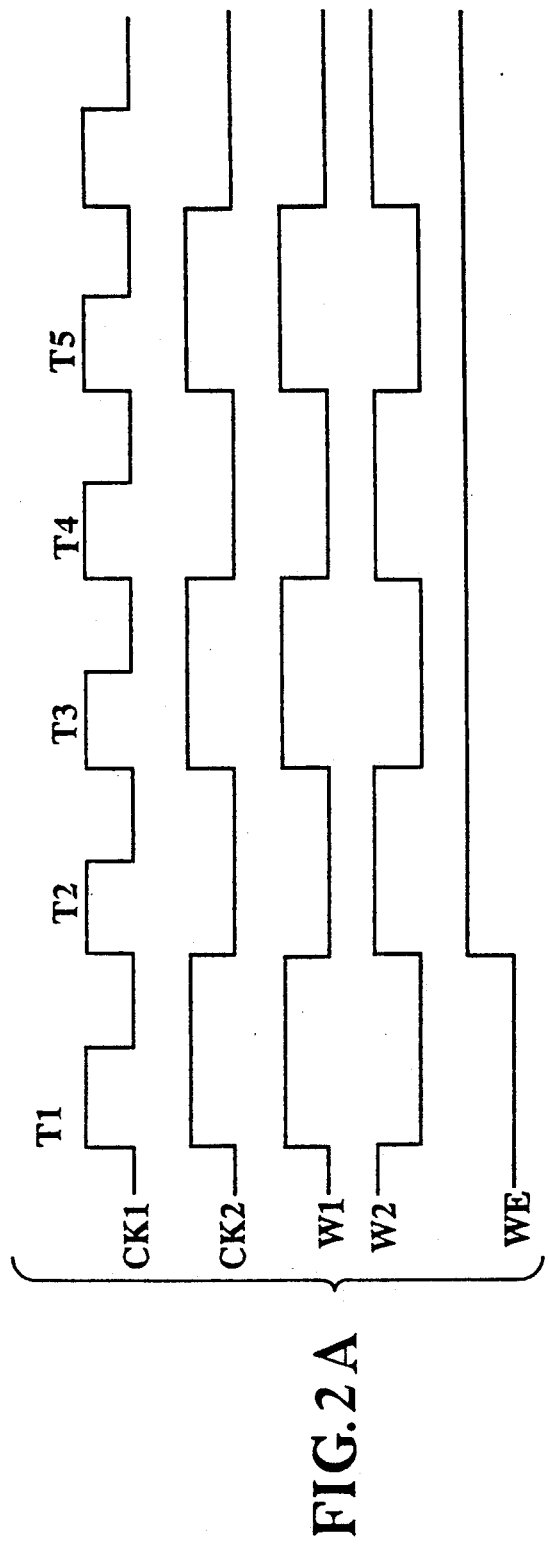
FIGS. 2(a) and 2(b) are timing charts of the signals as shown in FIG. 1.
Figure 2B:
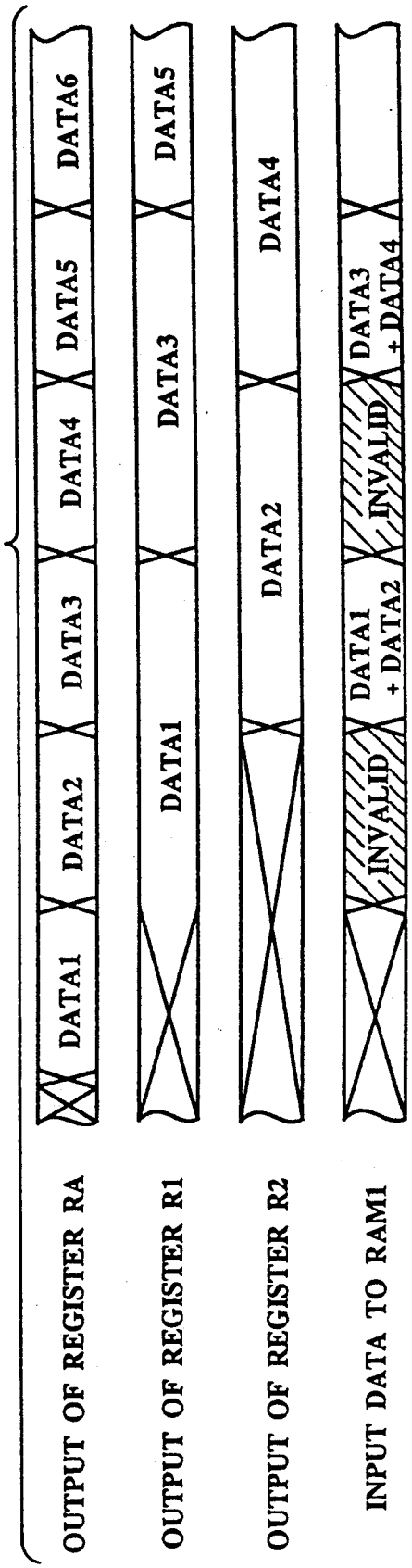

Accordingly, no buffer register R1, R2 as shown in FIG. 1 is needed for the information processing unit in accordance with the invention, and the stage number in the pipeline processing is decreased by one step. On addition, because of the decrease of one stage, the operation in which the data is memorized in the dual port RAM 30 is accomplished faster than the conventional operation by one cycle as known in FIG. 12 compared with FIG. 2. This means that the processing time is shortened.

Figure 13:
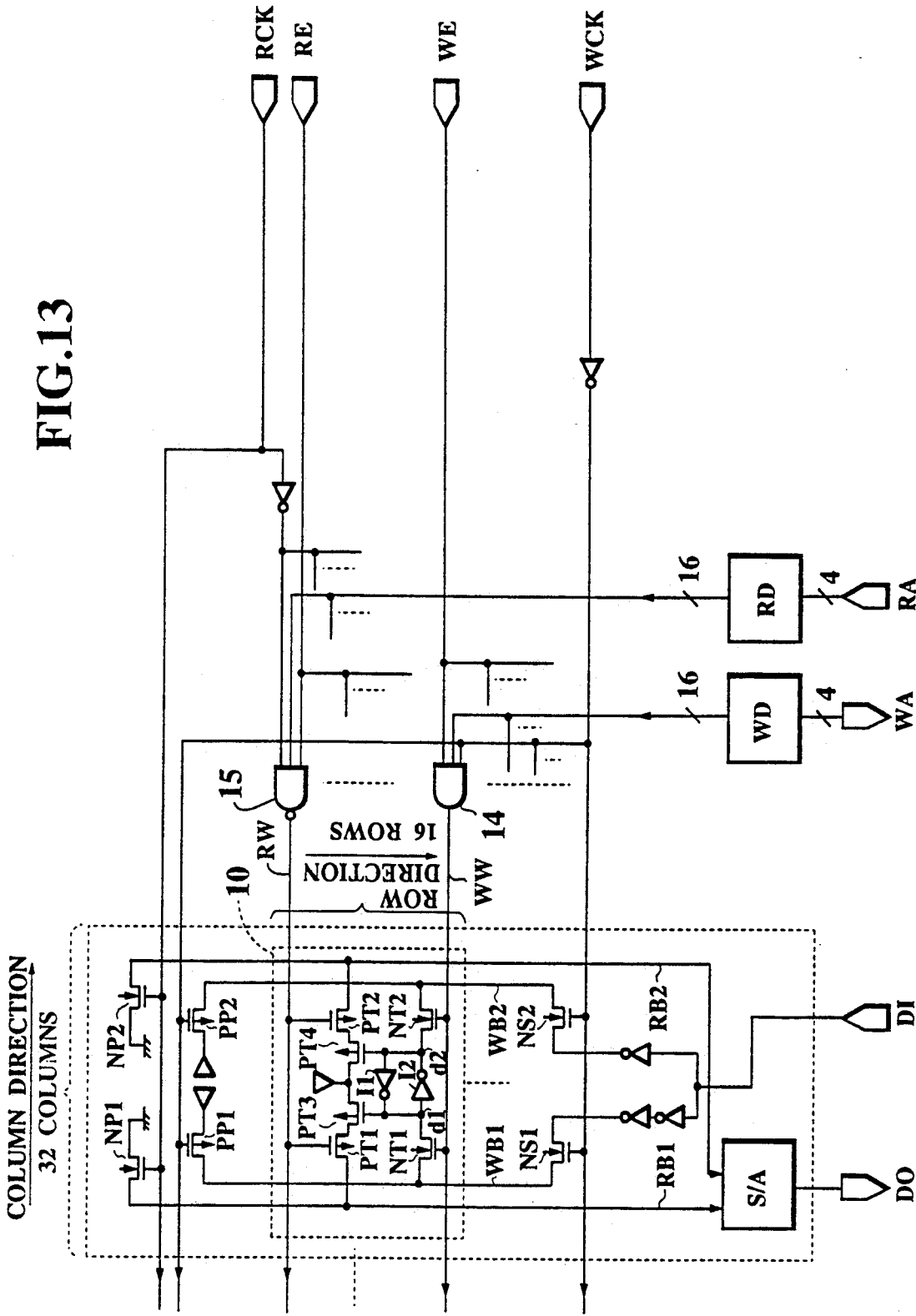
FIG. 13 is a block diagram of another dual port RAM in accordance with a third embodiment at the first aspect of the invention.

FIG. 13 is a block diagram similar to FIG. 6, showing another dual port RAM 40 in accordance with the invention.

When the element shown in the following drawings has the same function as the element shown in the previous drawings, the element shown in the following drawings is designated with the same reference number as the element shown in the previous drawings.

The dual port RAM 40 shown in FIG. 13 is not provided with the AND gates 13, 14 in comparison with the dual port RAM 30 shown in FIG. 6 while the dual port RAM 40 is provided with the other elements shown in FIG. 6. That is, the input data DI is transmitted to all of the write private bit lines WB1, WB2 because all of the N channel select FETs NS1, NS2 is turned on by receiving the inverted signal of the write private clock signal WCK at one time. In other words, the 32 bits input data DI is memorized in the unit memory cells 10 as a word of 32 bits in one lump sum.

In the above mentioned structure, the input/output operation are respectively and independently carried out similar to the dual port RAM 30 shown in FIG. 6.

Figure 14:
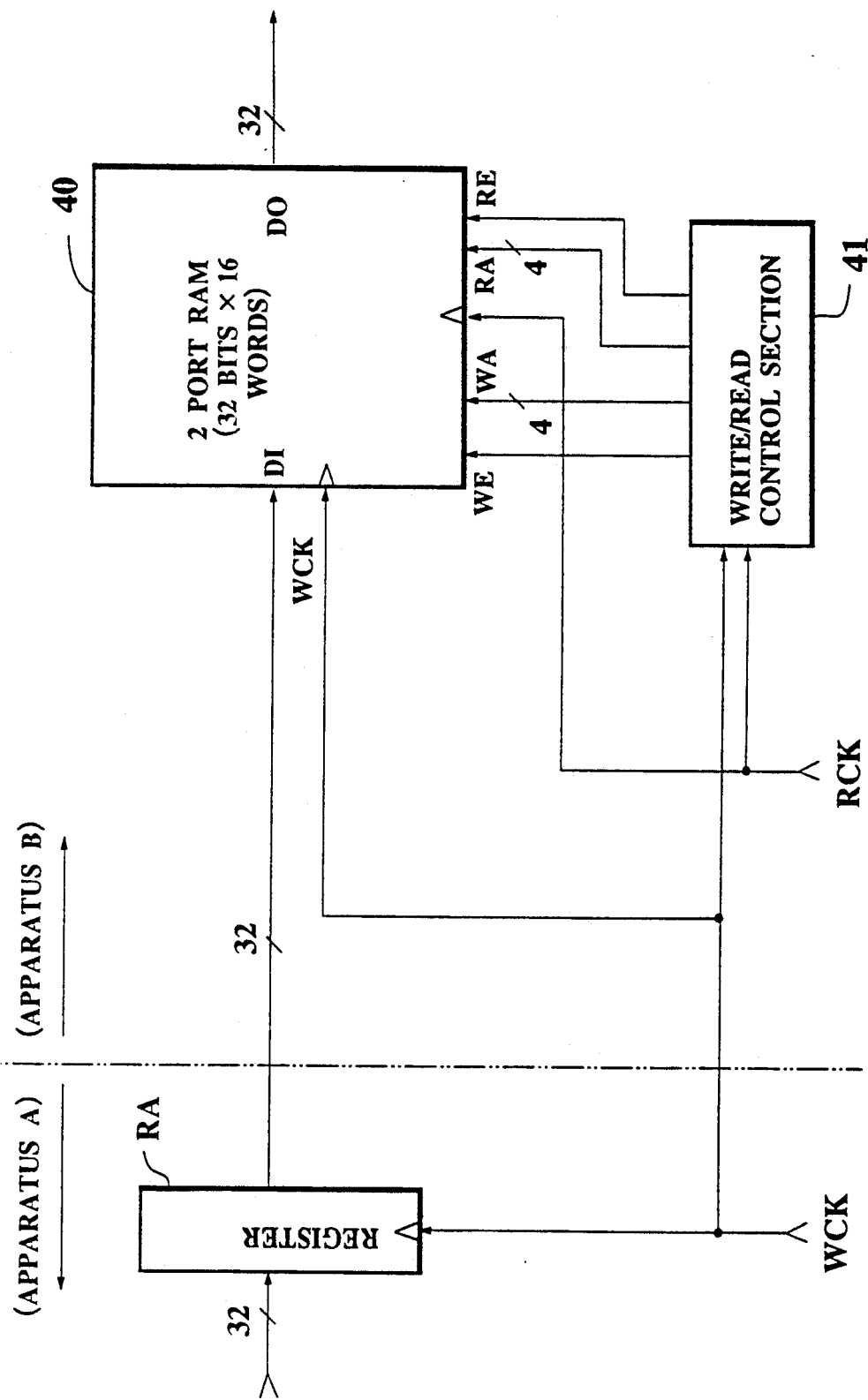
FIG. 14 is a block diagram of an information processing unit including the dual port RAM as shown in FIG. 6 in accordance with a second embodiment at a second aspect of the invention.
Figure 15:
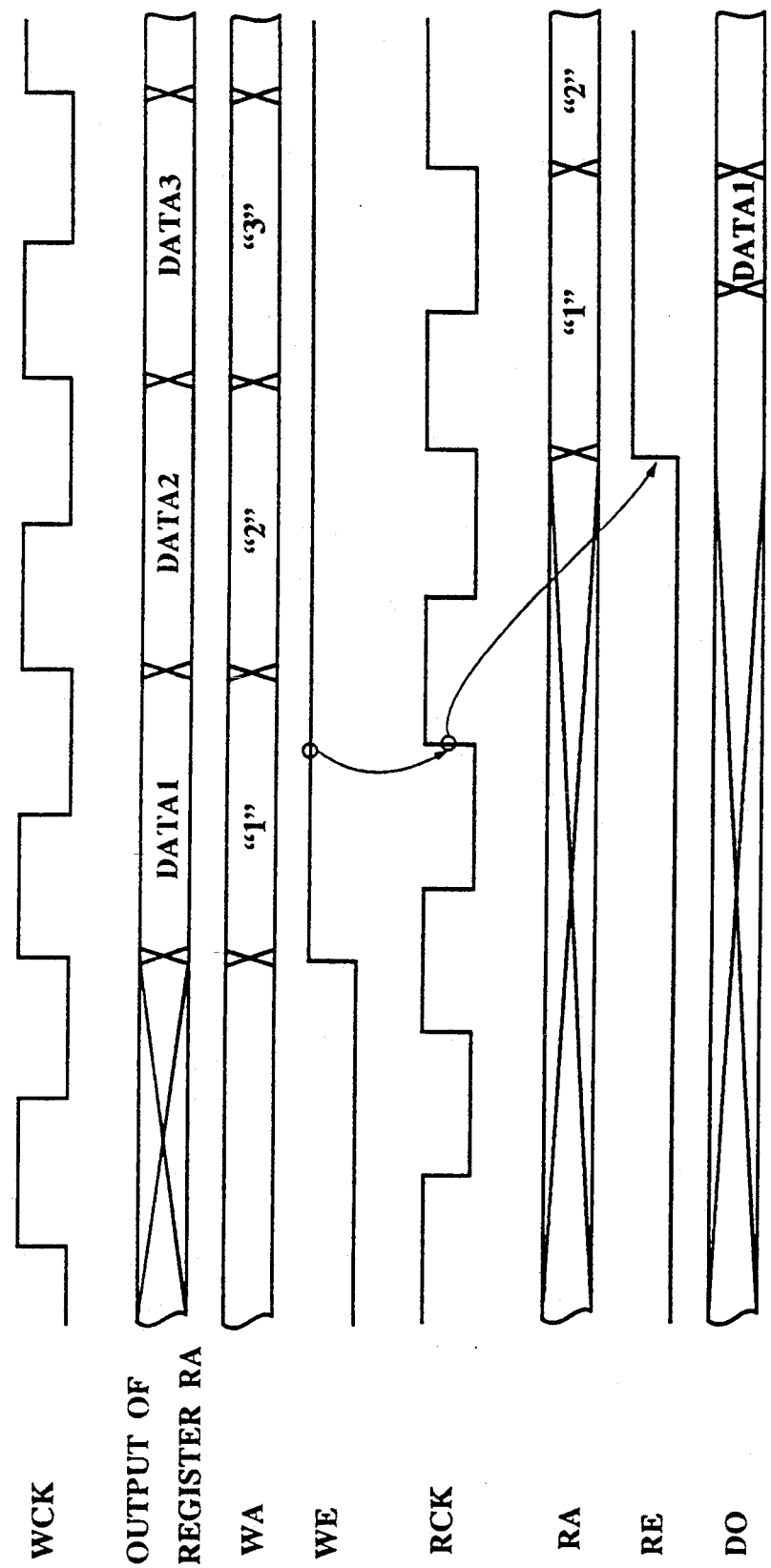
FIG. 15 is a timing chart of the signals as shown in FIG. 14.

FIG. 14 is a block diagram of an information processing unit including the dual port RAM 40 as shown in FIG. 13 in accordance with the invention and FIG. 15 is a timing chart for the information processing unit as shown in FIG. 14.

Figure 3:
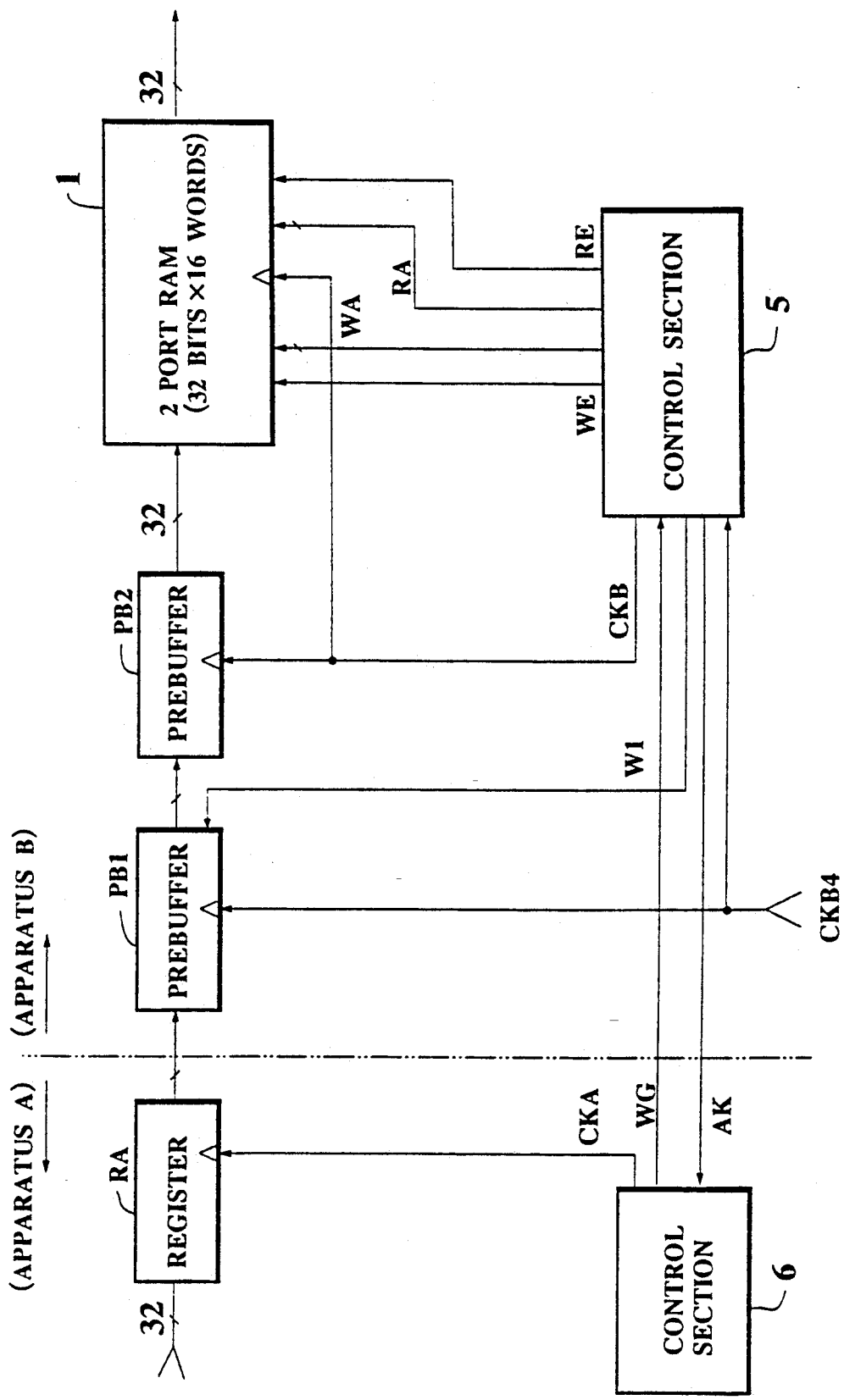
FIG. 3 is a block diagram of another conventional information processing unit.
Figure 4:
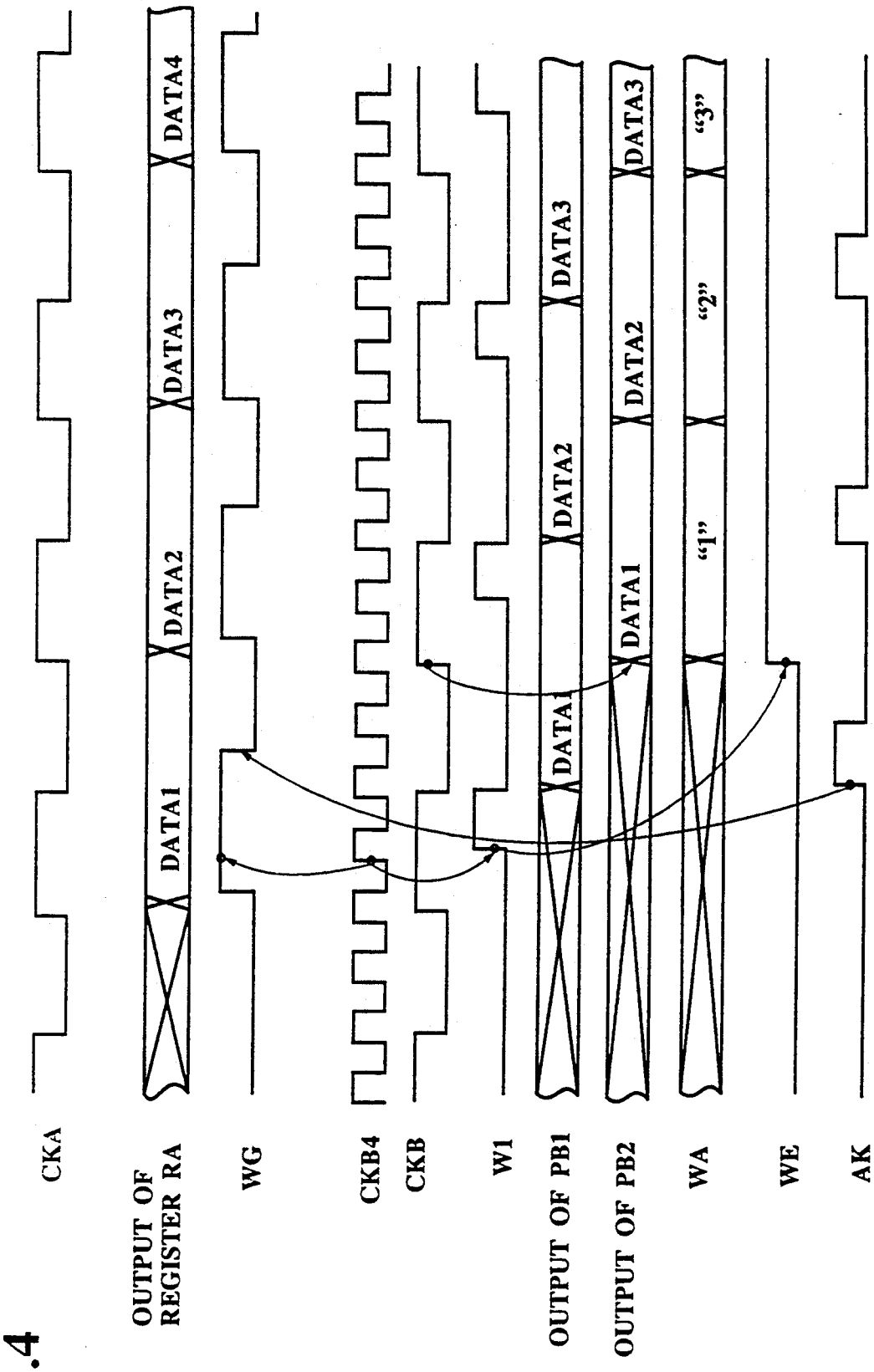
FIG. 4 and FIG. 5 are respectively a timing chart of the signals as shown in FIG. 3.
Figure 5:
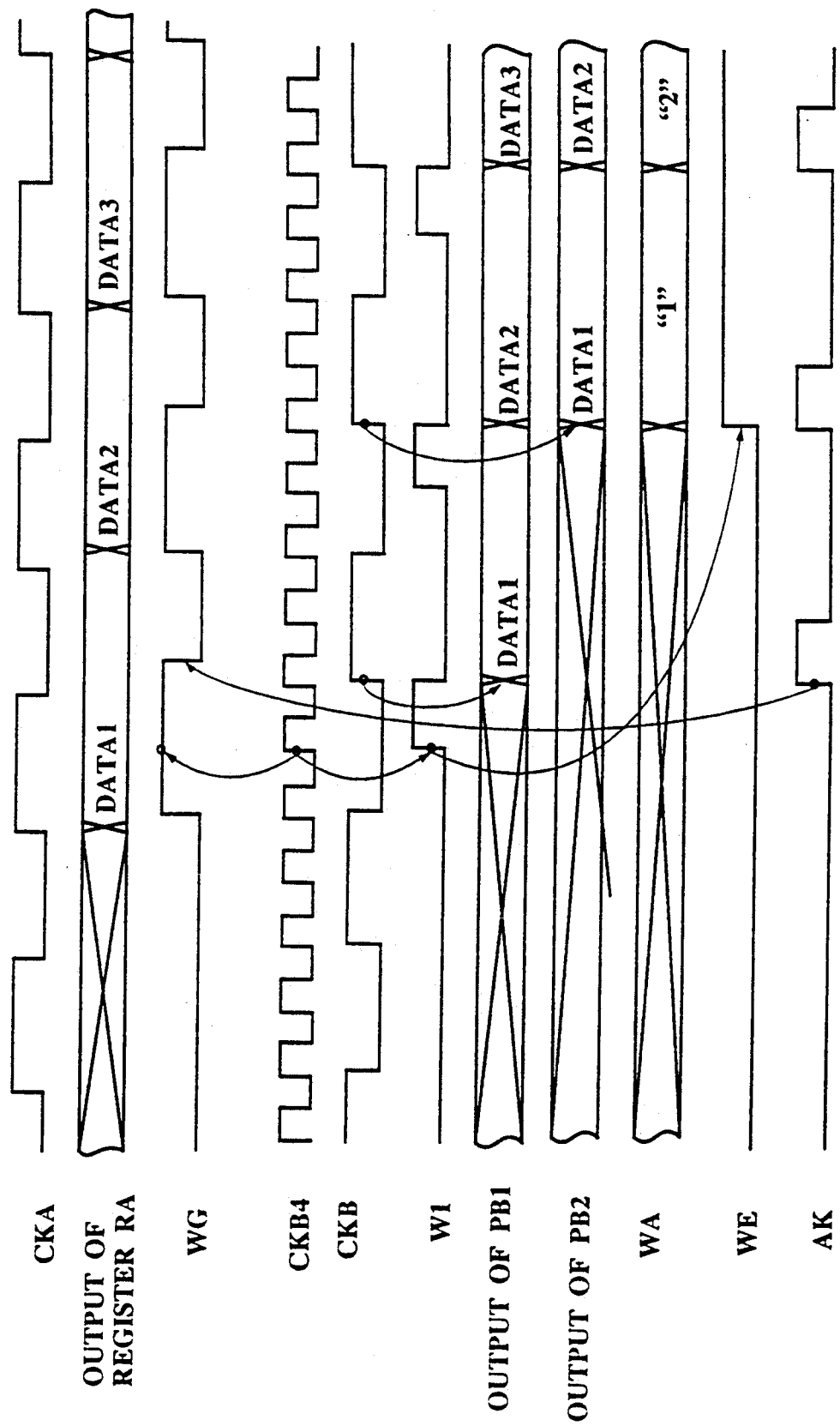

The information processing unit shown in FIG. 14 is shown for the comparison with the information processing unit shown in FIG. 3, and the timing chart shown in FIG. 15 is corresponding to the timing charts shown in FIG. 4 and FIG. 5.

As shown in FIG. 14, the information processing unit comprises a register RA for providing a 32 bits data to an apparatus B from an apparatus A in synchronization with a write clock signal WCK, the dual port RAM 40 for receiving the 32 bits data from the register RA as an input data DI in synchronization with the write clock signal WCK, and a write/read control section 41 for controlling the dual port RAM 40 by providing the control/address signals, such write/read enable signals WE, RE and the write/read address signals WA, RA.

The write private clock signal WCK and a read private clock signal RCK are provided to the write/read control section 41 to use as a control signal provided to the dual port RAM 40 and an operational clock signal for the write/read address signals.

In the above mentioned structure, a 32 bits data is provided to the input port of the dual port RAM 40 from the register RA in apparatus A in synchronization with a write private clock signal WCK which is an operational clock in the apparatus A. Thereafter, a 32 bits data memorized in the dual port RAM 40 is read out from the output port of the dual port RAM 40 to be processed in the apparatus B in synchronization with the read private clock signal RCK which is an operational clock in the apparatus B.

As shown in FIG. 15, the write enable signal WE is detected at the timing of the leading edge of the read private clock signal RCK, and the read operation is started from the timing of the next leading edge of the signal RCK.

Therefore, for example, after the write operation in the address "1" is completed, the output data DO is read out from the address "1". This means that the write operation and the read operation are not carried out in the same address at the same time.

Accordingly no prebuffer PB1, PB2 as shown in FIG. 3 is needed for matching the write operation to the read operation, and the structure for carrying out the hand shaking method and the clock signal CK4B in high frequency for detecting the phase shift between the clock signal CKA and the clock signal CKB are not needed. This means that it is capable for the information processing unit to largely be simplified.

Figure 16:
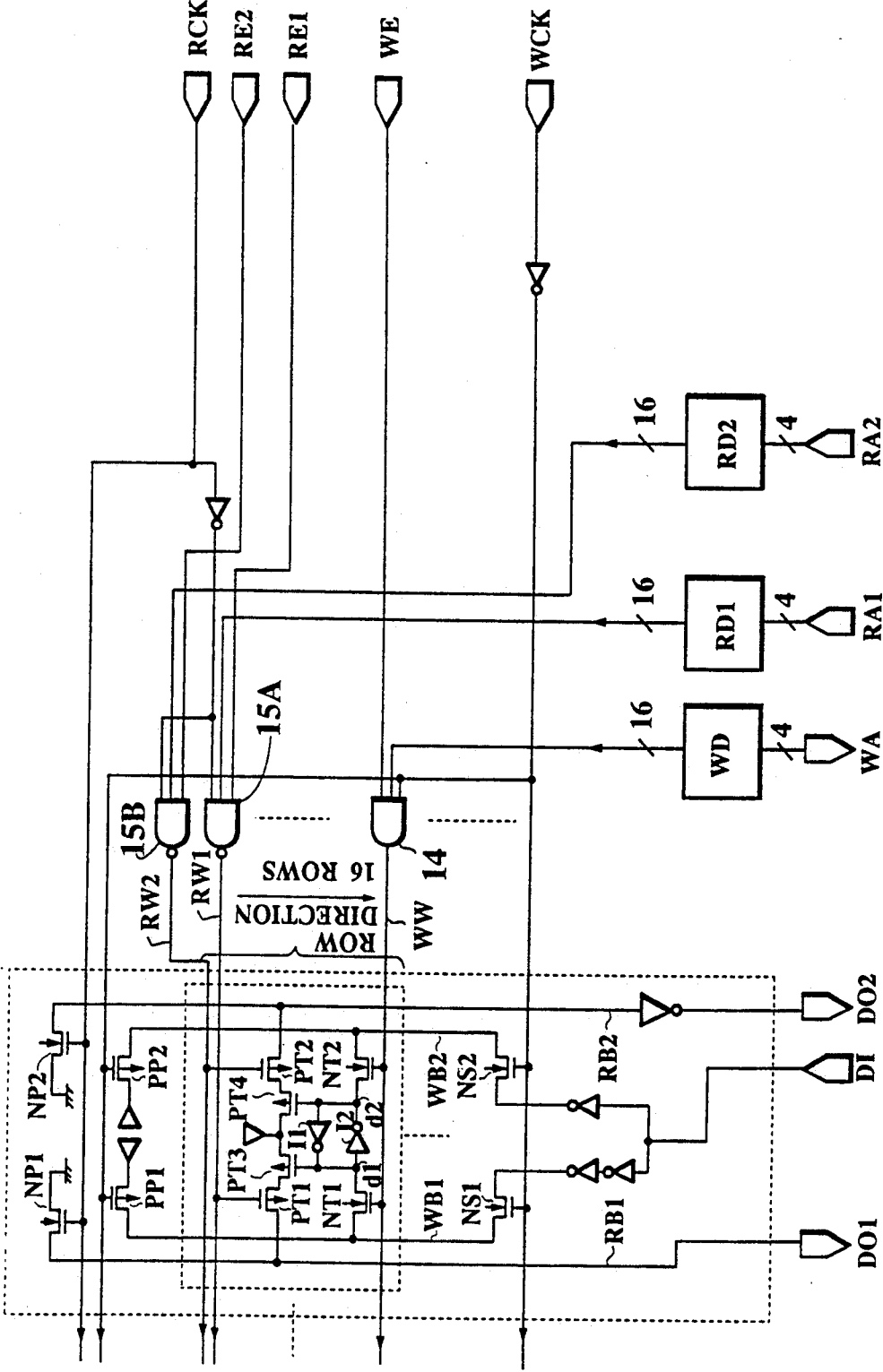
FIG. 16 is a block diagram of a still other multiport RAM in accordance with a fourth embodiment at a first aspect of the invention.

FIG. 16 is a block diagram of other multiport RAM in accordance with the invention.

As shown in FIG. 16, the multiport RAM is not provided with the sense amplifier S/A in comparison with the dual port RAM 40 shown in FIG. 13 while the multiport RAM shown in FIG. 16 is provided with the other elements shown in FIG. 13 and two series of read address designation sections.

That is, the multiport RAM shown in FIG. 16 has two output ports for two output data DO1, DO2 and one input port for one input data DI.

Each of the read address designation sections is provided with a read decorder RD1 (RD2) for receiving 4 bits read address signal RA1 (RA2) and an NAND circuit 15A (15B) for receiving a 16 bits read address signal RA1 (RA2), a read enable signal RE1 (RE2) and a read private clock signal RCK. The NAND circuit 15A (15B) provides an output signal on a read word line RW1 (RW2) which is connected to a gate of a N channel FET PT1 (PT2).

Two series of the read address designation sections are respectively operated independently and in parallel.

Accordingly, the write/read operation are respectively operated independently and in parallel in the same way as the multiport RAM shown in FIG. 13. On addition, two output data DO1, DO2 are read independently and in parallel in the read operation. Therefore, the various data transmission is capable by using the multiport RAM shown in FIG. 16.

Having illustrated and described the principles of our invention in a preferred embodiment thereof, it should be readily apparent to those skilled in the art that the invention can be modified in arrangement and detail without departing from such principles. We claim all modifications coming within the sprit and scope of the accompanying claims.

What is claims is:

1. A multiport RAM, comprising:
   a memory section formed of unit memory cells which are positioned to an orderly matrix of M columns by N rows (M and N are respectively a natural number);
   a write address designation section for designating one or more prescribed rows in said memory section to write an input data;
   a write private clock signal by which said input data is synchronized in a write operation in which said data is written in said unit memory cells on said rows designated by said write address designation section;
   a write precharge circuit for precharging data write lines on which said input data is transmitted in synchronization with said write private clock signal prior to said write operation;
   a read address designation section for designating one or more prescribed rows in said memory section to read out an output data;
   a read private clock signal by which said output data is synchronized in a read operation in which said data is read out from said unit memory cells on said rows designated by said read address designation section, said read private clock signal having no relation with said write private clock signal; and
   a read precharge circuit for precharging data read lines on which said output data is transmitted in synchronization with said read private clock signal prior to said read operation;
   wherein said precharging of said data write lines and said data read lines is performed by selectively connecting said data write lines to a voltage source through a switching device which operates in synchronization with said write private clock and by selectively connecting said read data lines to a voltage source through a switching device which operates in synchronization with said read private clock.

2. A multiport RAM according to claim 1 in which said write address designation section is provided with N logic gate circuits in correspondence to said N rows in said memory section, wherein each logic gate circuit receives said write private clock signal and a write address signal formed of N bits in correspondence to said N rows in said memory section and provides a write signal to said unit memory cells of a corresponding row so that said unit memory cells are respectively connected to data write lines on which said input data is transmitted.

3. A multiport RAM according to claim 2 in which said write signal is transmitted to transistors of said unit memory cells, so that said transistors are turned on, wherein said transistors are respectively positioned between said data write lines and unit memory cells.

4. A multiport RAM according to claim 1 in which said read address designation section is provided with N logic gate circuits in correspondence to said N rows in said memory section, wherein each logic gate circuit receives said read private clock signal and a read address signal formed of N bits in correspondence to said memory section and provides a read signal to said unit memory cells of a corresponding row, so that said unit memory cells are respectively connected to data read lines on which said output data is transmitted.

5. A multiport RAM according to claim 4 in which said read signal is transmitted to transistors of said unit memory cells so that said transistors are turned on, wherein said transistors are respectively positioned between said data read lines and said unit memory cells.

6. A multiport RAM according to claim 1 including:
   a column select section for selecting one or more columns from said M columns in said memory section in accordance with a write select signal so that data write lines on which said input data is transmitted are connected to said selected columns, designated by said write private clock signal.

7. A multiport RAM according to claim 6 in which said column select section selects one of a higher rank bits and a lower rank bits when N columns in said memory section is divided into two ranks.

8. A multiport RAM according to claim 7 in which said column select section is formed of a logic gate circuit.

9. A multiport RAM according to claim 7 in which said column select section is provided with a first logic gate circuit and a second logic gate circuit, wherein a lower rank write signal is transmitted to said memory section from said first logic gate circuit to select said lower rank bits when said write select signal at a high level is provided to said first logic gate circuit, and a higher rank write signal is transmitted to said memory section from said second logic gate circuit to select said higher rank bits when said write select signal at a low level is provided to said second logic gate circuit.

10. A multiport RAM according to claim 9 in which said column select section has transistors on said data write lines, wherein each transistor is turned on by receiving one of said lower and said higher rank write signal.

11. A multiport RAM according to claim 1 in which the memory section has the unit memory cells of 32 columns by 16 rows, that is, 32 bits by 16 words.

12. A multiport RAM, comprising:
    a memory section formed of an orderly matrix of unit memory cells of M columns by N rows (M and N are respectively a natural number);
    write address signals for designating one or more unit memory cells on one or more prescribed columns and rows in said memory section as a write address;
    a write clock signal by which an input data is synchronized in a write operation in which said data is written in said unit memory cells on said rows and columns designated by said write address signals;
    a write precharge circuit for precharging data write lines on which said input data is transmitted in synchronization with said write clock signal prior to said write operation;
    a write control signal generating section for generating write control/address signals by which said input data is written in said unit memory cells on said rows and columns designated by said write address signals in synchronization with said write clock signal;
    read address signals for designating one or more prescribed columns and rows in said memory section as a read address;
    a read clock signal by which an output data is synchronized in a read operation in which said data is read out from said unit memory cells on said rows and columns designated by said read address signals;
    a read precharge circuit for precharging data read lines on which said output data is transmitted in synchronization with said read clock signal prior to said read operation; and a read control signal generating section for generating read control/address signals by which said output data is read out from said unit memory cells on said rows and columns designated by said read address signals in synchronization with said read clock signal having no relation with said write clock signal;

wherein said precharging of said date write lines is performed by selectively connecting said data write lines to a voltage source through a switching device which operates in synchronization with said write clock signal; and wherein said precharging of said read data is performed by selectively connecting said data read lines to a voltage source through a switching device which operates in synchronization with said read clock signal.

13. A multiport RAM according to claim 12 in which said memory section is provided with a data input section and a write column select section for connecting said data input section to said unit memory cells on said prescribed columns selected by receiving a write column select signal.

14. A multiport RAM according to claim 12 in which said memory section is provided with a read column select section for connecting said unit memory cells on said prescribed columns selected by receiving a read column select signal to data read lines on which said output data is transmitted.

15. An information processing unit, comprising:
a register in which an input data is memorized to provide input data to a data receiving section in synchronization with a write clock signal;
a multiport RAM formed of an orderly matrix of unit memory cells in said data receiving section, said input data written in one or more rows of said unit memory cells;
a write control section for controlling a write operation by transmitting a write address signal to said multiport RAM in synchronization with said write clock signal to select one or more unit memory cells in which said input data are respectively memorized;
a write precharge circuit for precharging data write lines on which said input data is transmitted in synchronization with said write clock signal prior to said write operation; and
a read control section for controlling a read operation by transmitting a read address signal to said multiport RAM in synchronization with a read clock signal to select one or more unit memory cells, said read clock signal having no relation with said write clock signal; and
a read precharge circuit for precharging data read lines on which an output data is transmitted in synchronization with said read clock signal prior to said read operation;
wherein said precharging of said data write lines is performed by selectively connecting said data write lines to a voltage source through a switching device which operates in synchronization with said write clock signal; and
wherein said precharging of said read data lines is performed by selectively connecting said data read lines to a voltage source through a switching device which operates in synchronization with said read clock signal.

16. An information processing unit according to claim 15 in which said multiport RAM is provided with a memory section formed of many unit memory cells which are positioned to an orderly matrix of M columns by N rows (M and N are respectively a natural number);
a write address designation section for designating one or more prescribed rows in said memory section to write an input data;
a write private clock signal by which said input data provided from a register is synchronized in said write operation, in which said data is written in said unit memory cells on said rows designated by said write address designation section;
a read address designation section for designating one or more prescribed rows in said memory section to read out an output data; and
a read private clock signal by which said output data is synchronized in said read operation, in which said data is read out from said unit memory cells on said rows designation by said read address designation section, said read private clock signal having no relation with said write private clock signal.

17. An information processing unit according to claim 15 wherein:
said multiport RAM includes a memory section formed of any orderly matrix of unit memory cells of M columns by N rows (M and N are respectively a natural number);
said write address signals designate one or more prescribed columns and rows in said memory section as a write address;
said input data is provided from a register synchronized with said write clock signal in said write operation in which said input data is written in said unit memory cells on said rows and said columns designated by said write address signals;
said information processing unit includes a write control signal generating section for generating write control/address signals by which said input data is written in said unit memory cells on said rows and said columns designated by write address signals in synchronization with said write clock signal;
said read address signals designate one or more unit memory cells on one or more prescribed columns and rows in said memory section as a read address;
said output data is synchronized with said read clock signal in said read operation in which said output data is read out from said unit memory cells on said rows and said columns designated by said read address signals; and
said information processing unit includes a read control signal generating section for generating read control/address signals by which said output data is read out from said unit memory cells on said rows and said columns designated by said read address signals in synchronization with said read clock signal having no relation with said write clock signal.

18. A multiport RAM comprising:
a plurality of latch circuits arranged in a matrix for storing binary data;
a plurality of first address lines extending in a row direction of said matrix and connected to said latch circuits in order to access said latch circuits on any row by activating one of said first address lines;
a plurality of second address lines extending in said row direction of said matrix and connected to said latch circuits in order to access said latch circuits on any row by activating one of said second address lines;

a plurality of first MOS FETs provided for each of said latch circuits respectively in a one-to-one correspondence, gate terminals of said first MOS FETs arranged in a same row being connected to a corresponding one of said first address lines in order that said first MOS FETs are turned on or off respectively when a common one of said first address lines is activated to access said latch circuits arranged on said same row;

a second MOS FET between a first voltage source and a first data line and having gate terminals connected to first clock lines in order that said second MOS FET is turned on or off to precharge said first data line in synchronism with a first clock signal supplied from said first clock lines, each of said first MOS FETs being connected between said first data line and a corresponding one of said latch circuits;

a plurality of third MOS FETs provided for said latch circuits respectively in a one-to-one correspondence, gate terminals of said third MOS FETs arranged in a same row being connected to a corresponding one of said second address lines in order that said third MOS FETs are turned on or off respectively when a common one of said second address lines is activated to access said latch circuits arranged on said same row; and a fourth MOS FET connected between a second voltage source and a second data line and having gate terminals connected to second clock lines in order that said fourth MOS FET is turned on or off to precharge said second data line in synchronism with a second clock signal supplied from said second clock lines, each of said first MOS FETs being connected between said second data line and a corresponding one of said latch circuits.

19. A multiport RAM according to claim 18 wherein each of said first MOS FETs is connected to a corresponding one of said latch circuits through a corresponding one of a plurality of fifth MOS FETs provided for said latch circuits in a one-to-one correspondence and having gate terminals connected to said latch circuits in order that said fifth MOS FET is turned on or off in accordance with the binary data stored in said corresponding latch circuit.

* * * * *